United States Patent
Ohta et al.

(10) Patent No.: US 8,487,374 B2
(45) Date of Patent: Jul. 16, 2013

(54) POWER SEMICONDUCTOR DEVICE

(75) Inventors: Hiroshi Ohta, Hyogo-ken (JP); Yasuto Sumi, Hyogo-ken (JP); Kiyoshi Kimura, Hyogo-ken (JP); Junji Suzuki, Hyogo-ken (JP); Hiroyuki Irifune, Hyogo-ken (JP); Wataru Saito, Kanagawa-ken (JP); Syotaro Ono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 13/234,802

(22) Filed: Sep. 16, 2011

(65) Prior Publication Data
US 2012/0074491 A1 Mar. 29, 2012

(30) Foreign Application Priority Data
Sep. 28, 2010 (JP) ................................. 2010-216583

(51) Int. Cl.
*H01L 29/66* (2006.01)
(52) U.S. Cl.
USPC ........................................................ 257/334
(58) Field of Classification Search
USPC ........................................................ 257/334
See application file for complete search history.

(56) References Cited

U.S. PATENT DOCUMENTS

| | | | |
|---|---|---|---|
| 6,677,626 B1 * | 1/2004 | Shindou et al. ............... | 257/266 |
| 7,816,756 B2 | 10/2010 | Saito | |
| 8,004,036 B2 * | 8/2011 | Hsieh ............................ | 257/328 |
| 8,013,360 B2 * | 9/2011 | Saito et al. .................... | 257/197 |
| 8,035,158 B2 * | 10/2011 | Miura et al. ................... | 257/329 |
| 2001/0028083 A1 * | 10/2001 | Onishi et al. .................. | 257/328 |
| 2001/0046739 A1 * | 11/2001 | Miyasaka et al. ............. | 438/268 |
| 2001/0052601 A1 * | 12/2001 | Onishi et al. .................. | 257/138 |
| 2002/0074596 A1 * | 6/2002 | Suzuki et al. ................. | 257/330 |
| 2002/0167020 A1 * | 11/2002 | Iwamoto et al. .............. | 257/110 |
| 2002/0171093 A1 * | 11/2002 | Onishi et al. .................. | 257/197 |
| 2003/0052329 A1 * | 3/2003 | Kobayashi et al. ........... | 257/135 |
| 2004/0065921 A1 * | 4/2004 | Iwamoto et al. .............. | 257/341 |
| 2004/0124465 A1 * | 7/2004 | Onishi et al. .................. | 257/341 |
| 2004/0206989 A1 * | 10/2004 | Aida et al. ..................... | 257/263 |
| 2005/0017292 A1 * | 1/2005 | Onishi et al. .................. | 257/328 |
| 2005/0098826 A1 * | 5/2005 | Yamaguchi et al. .......... | 257/341 |
| 2005/0145933 A1 * | 7/2005 | Onishi et al. .................. | 257/328 |
| 2005/0184336 A1 * | 8/2005 | Takahashi et al. ............ | 257/328 |
| 2005/0280086 A1 * | 12/2005 | Saito et al. .................... | 257/341 |
| 2006/0011962 A1 * | 1/2006 | Kocon .......................... | 257/302 |

(Continued)

FOREIGN PATENT DOCUMENTS

JP 2009-004681 1/2009

*Primary Examiner* — Jae Lee
*Assistant Examiner* — Grant Withers
(74) *Attorney, Agent, or Firm* — Patterson & Sheridan, LLP

(57) ABSTRACT

In general, according to one embodiment, a power semiconductor device includes a first pillar region, a second pillar region, and an epitaxial layer of a first conductivity type on a first semiconductor layer. The first pillar region is composed of a plurality of first pillar layers of a second conductivity type and a plurality of second pillar layers of the first conductivity type alternately arranged along a first direction. The second pillar region is adjacent to the first pillar region along the first direction and includes a third pillar layer of the second conductivity type, a fourth pillar layer of the first conductivity type, and a fifth pillar layer of the second conductivity type in this order along the first direction. A plurality of second base layers of the second conductivity type electrically connected, respectively, onto the third pillar layer and the fifth pillar layer and spaced from each other.

19 Claims, 6 Drawing Sheets

U.S. PATENT DOCUMENTS

| | | | |
|---|---|---|---|
| 2006/0124997 A1* | 6/2006 | Yamauchi et al. | 257/330 |
| 2006/0157813 A1* | 7/2006 | Saito et al. | 257/498 |
| 2006/0208334 A1* | 9/2006 | Yamauchi et al. | 257/491 |
| 2006/0220156 A1* | 10/2006 | Saito et al. | 257/409 |
| 2006/0231917 A1* | 10/2006 | Ono et al. | 257/500 |
| 2007/0001194 A1* | 1/2007 | Ono et al. | 257/127 |
| 2007/0040217 A1* | 2/2007 | Saito et al. | 257/341 |
| 2007/0052015 A1* | 3/2007 | Miura et al. | 257/331 |
| 2007/0194375 A1* | 8/2007 | Kawaguchi et al. | 257/330 |
| 2007/0207597 A1* | 9/2007 | Takahashi et al. | 438/478 |
| 2007/0238271 A1* | 10/2007 | Yamauchi et al. | 438/494 |
| 2007/0272979 A1* | 11/2007 | Saito et al. | 257/335 |
| 2008/0076223 A1* | 3/2008 | Ninomiya et al. | 438/270 |
| 2008/0087952 A1* | 4/2008 | Pfirsch | 257/334 |
| 2008/0116512 A1* | 5/2008 | Kawaguchi et al. | 257/334 |
| 2008/0179671 A1* | 7/2008 | Saito et al. | 257/341 |
| 2008/0211020 A1* | 9/2008 | Saito | 257/342 |
| 2008/0290403 A1* | 11/2008 | Ono et al. | 257/329 |
| 2009/0079002 A1* | 3/2009 | Lee et al. | 257/355 |
| 2009/0096030 A1* | 4/2009 | Ishida et al. | 257/368 |
| 2009/0101974 A1* | 4/2009 | Saito et al. | 257/342 |
| 2009/0236697 A1* | 9/2009 | Ono et al. | 257/618 |
| 2009/0302376 A1* | 12/2009 | Inoue et al. | 257/329 |
| 2010/0022075 A1* | 1/2010 | Takahashi et al. | 438/493 |
| 2010/0025760 A1* | 2/2010 | Kawashima | 257/334 |
| 2010/0123186 A1* | 5/2010 | Ohta et al. | 257/329 |
| 2010/0140695 A1* | 6/2010 | Yedinak et al. | 257/334 |
| 2011/0018055 A1* | 1/2011 | Ohta et al. | 257/329 |
| 2012/0086073 A1* | 4/2012 | Akiyama et al. | 257/330 |
| 2012/0211831 A1* | 8/2012 | Hsieh | 257/334 |
| 2012/0241847 A1* | 9/2012 | Saito et al. | 257/328 |
| 2013/0029466 A1* | 1/2013 | Hozumi et al. | 438/270 |

* cited by examiner

US 8,487,374 B2

POWER SEMICONDUCTOR DEVICE

CROSS-REFERENCE TO RELATED APPLICATIONS

This application is based upon and claims the benefit of priority from the prior Japanese Patent Application No. 2010-216583, filed on Sep. 28, 2010; the entire contents of which are incorporated herein by reference.

FIELD

Embodiments described herein relate generally to a power semiconductor device such as a power MOSFET.

BACKGROUND

A power MOSFET (Metal Oxide Semiconductor Field Effect Transistor) includes a device region for passing current, and a termination region formed around the device region in the outer peripheral portion of the chip. In order to prevent destruction of the power MOSFET when avalanche breakdown occurs in the drift layer of the power MOSFET, carriers generated by avalanche breakdown need to be ejected from the device region side to a source electrode. The device region has a larger cross-sectional area for ejecting carriers to the source electrode than the termination region. Hence, the device region has lower ejection resistance, and can prevent device destruction due to current concentration. Thus, it is desirable that the breakdown voltage of the device region be set lower than that of the termination region.

Furthermore, to increase the breakdown voltage of the power MOSFET, the drift layer needs to be a high resistance layer with low impurity concentration. However, because the on-resistance is desirably reduced in the device region, the drift layer is desired to be a low resistance layer with high impurity concentration. Thus, there is a tradeoff between the breakdown voltage and the on-resistance of the power MOSFET. To improve this tradeoff, a super junction structure is used in the drift layer of the power MOSFET. By using a super junction structure in the drift layer, the breakdown voltage of the power MOSFET can be increased while increasing the impurity concentration of the current path.

The drift layer of the power MOSFET is designed so as to include a super junction structure in the device region and a high resistance layer in the termination region. The super junction structure can reduce the on-resistance while maintaining high breakdown voltage. The high resistance layer has high resistance, but its breakdown voltage is even higher. In the power MOSFET with such structure, avalanche breakdown occurs in the device region rather than in the termination region. Hence, this power MOSFET has the characteristics of high avalanche withstand capability, low on-resistance, and high breakdown voltage.

DETAILED DESCRIPTION

Figure 1:
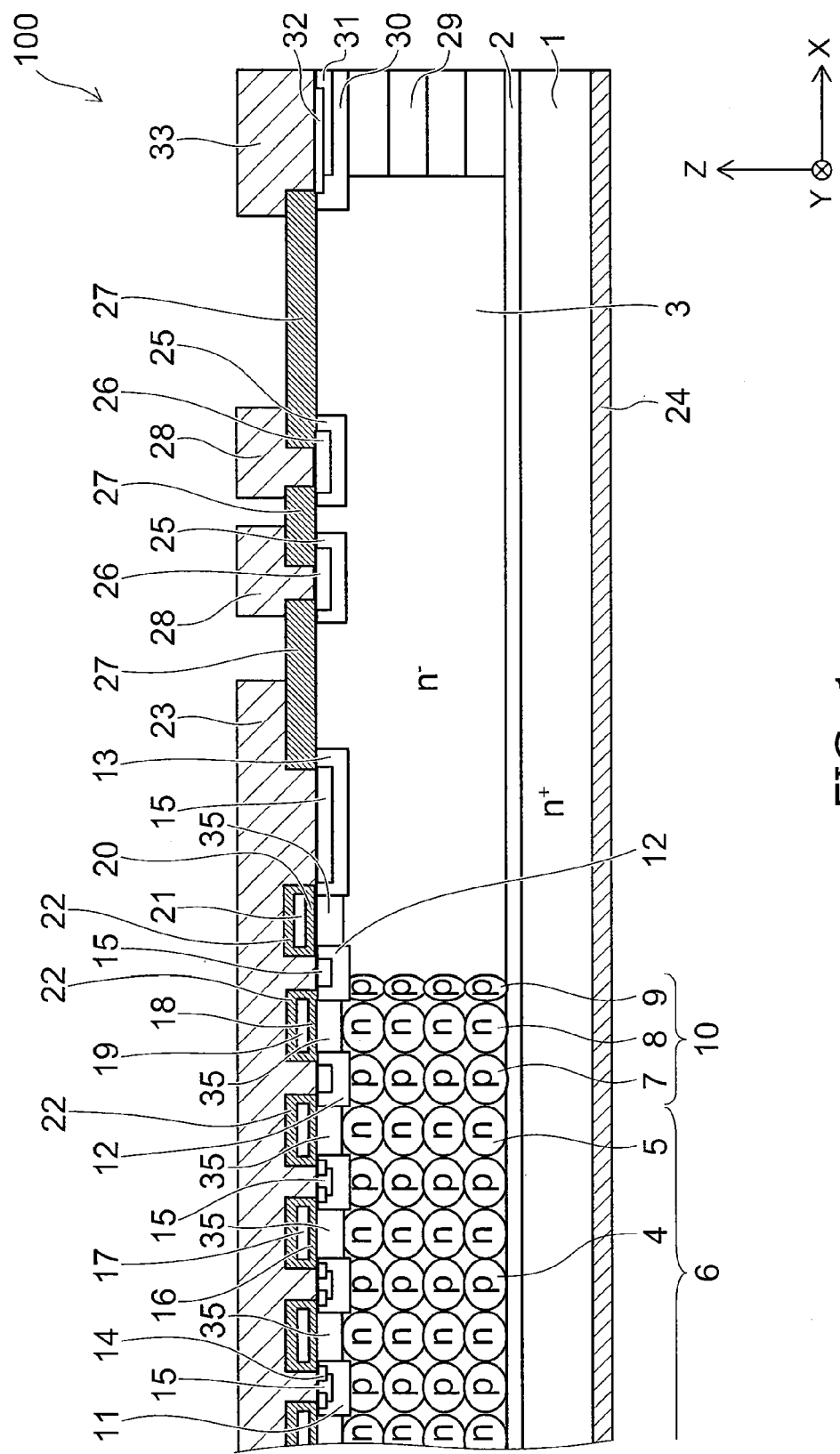
FIG. 1 is a schematic sectional view of a main part of a power semiconductor device according to a first embodiment.

In general, according to one embodiment, a power semiconductor device includes a first semiconductor layer of a first conductivity type, a first pillar region, a second pillar region, an epitaxial layer of the first conductivity type, a plurality of first base layers of the second conductivity type, a plurality of second base layers of the second conductivity type, a third base layer of the second conductivity type, a plurality of source layers of the first conductivity type, a first gate electrode, a second gate electrode, a third gate electrode, a first electrode, and a second electrode. The first semiconductor layer has a first surface. The first pillar region is provided on the first surface of the first semiconductor layer. The first pillar region is composed of a plurality of first pillar layers of a second conductivity type and a plurality of second pillar layers of the first conductivity type. The plurality of first pillar layers and the plurality of second pillar layers are alternately and repeatedly arranged along a first direction parallel to the first surface. The second pillar region is provided on the first surface of the first semiconductor layer and is adjacent to the second pillar layer of the first pillar region along the first direction. The second pillar region is composed of a pillar set and a fifth pillar layer of the second conductivity type. The pillar set is composed of at least one third pillar layer of the second conductivity type and one fourth pillar layer of the first conductivity type adjacent to the third pillar layer along the first direction. The fifth pillar layer is adjacent to the pillar set along the first direction. The epitaxial layer is provided on the first surface of the first semiconductor layer and is adjacent to the second pillar region along the first direction. The epitaxial layer has a lower first conductivity type impurity concentration than the second pillar layer. The plurality of first base layers are electrically connected, respectively, onto the plurality of first pillar layers and spaced from each other. The plurality of second base layers of the second conductivity type electrically connected, respectively, onto the third pillar layer and the fifth pillar layer and spaced from each other. The third base layer is provided on a surface of the epitaxial layer so as to be adjacently spaced from the second base layer of the plurality of second base layers connected onto the fifth pillar layer. The plurality of source layers are selectively formed in respective surfaces of the plurality of first base layers and have a higher first conductivity type impurity concentration than the epitaxial layer. The first gate electrode is provided via a first gate insulating film on each of adjacent ones of the plurality of first base layers, on one of the plurality of source layers formed on the adjacent first base layers, and on the second pillar layer. The second gate electrode is provided via a second gate insulating film on each of adjacent ones of the plurality of second base layers and on the fourth pillar layer. The third gate electrode is provided via a third gate insulating film on each of the third base layer and the second base layer connected onto the fifth pillar layer. The first electrode is provided on and electrically connected to a surface of the first semiconductor layer opposite to the first surface. The second electrode is electrically connected to each of the source layers, the first base layers, the second base layers, and the third base layer.

Various embodiments will be described hereinafter with reference to the accompanying drawings. The figures used in describing the embodiments are schematic for ease of description. In actual practice, the shape, dimension, and size relation of components in the figures are not necessarily identical to those shown in the figures, but can be suitably modified as long as the effect of the invention is achieved. Although it is assumed in this description that the first conductivity type is n-type and the second conductivity type is p-type, these conductivity types can be interchanged. Although silicon is taken as an example of semiconductor, the embodiments are also applicable to compound semiconductors such as SiC and GaN. Although silicon oxide film is taken as an example of insulating film, it is also possible to use other insulators such as silicon nitride film, silicon oxynitride film, and alumina. In the case where the conductivity type of n-type is denoted by $n^+$, n, and $n^-$, it is assumed that the n-type impurity concentration decreases in this order. Also with regard to p-type, it is assumed that the p-type impurity concentration decreases in the order of $p^+$, p, and $p^-$.

First Embodiment

Figure 2:
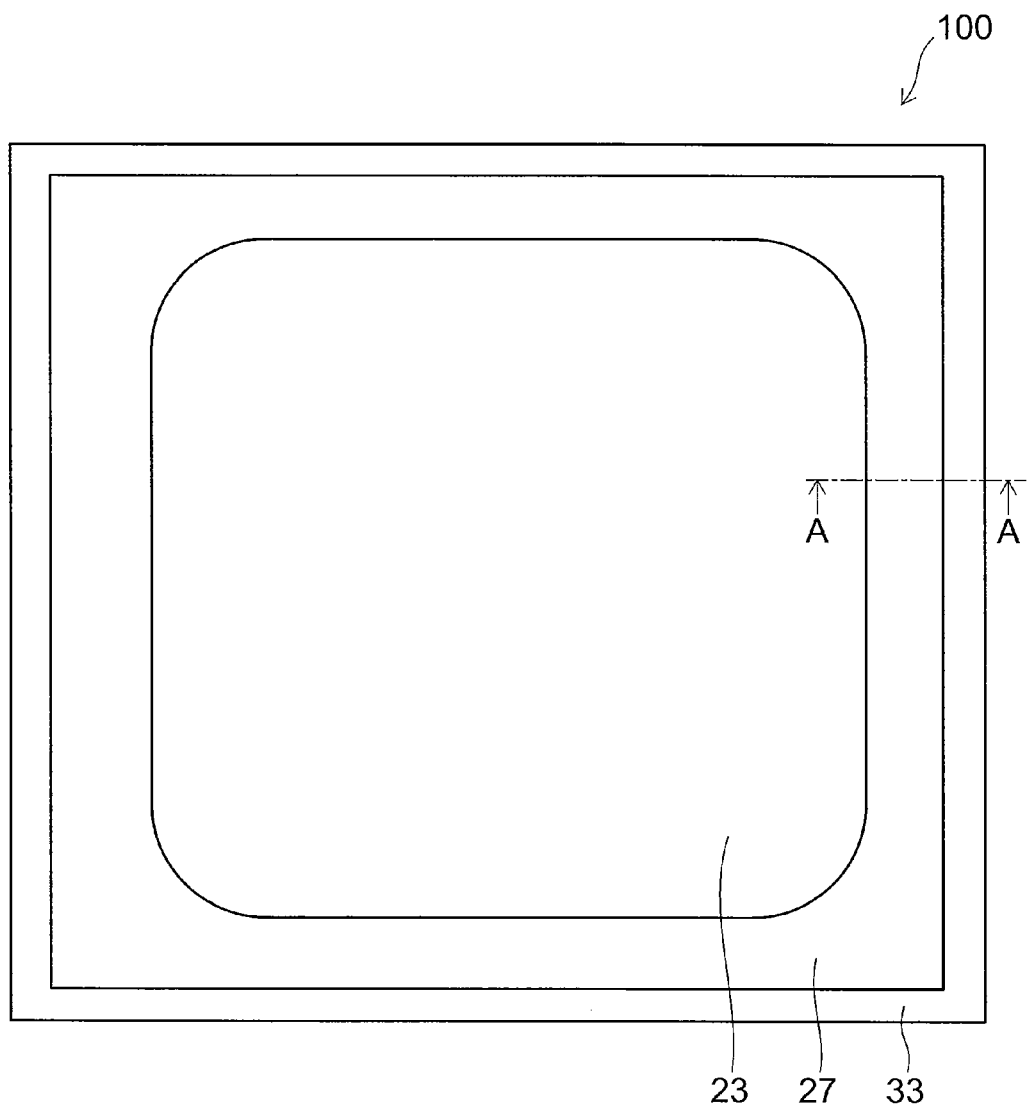
FIG. 2 is a plan view of the power semiconductor device according to the first embodiment.

A first embodiment is described with reference to FIG. 1. FIG. 1 is a schematic sectional view of the main part of a power semiconductor device 100 according to the first embodiment of the invention. FIG. 2 is a plan view of the power semiconductor device 100. The cross section taken along line A-A as viewed in the arrow direction of FIG. 2 is shown in FIG. 1. In the plan view of FIG. 2, the field plate electrode 28, described later, in FIG. 1 is omitted.

As shown in FIGS. 1 and 2, the semiconductor device 100 according to this embodiment is configured as follows. An $n^+$-type drain layer (first semiconductor layer) 1 has an n-type impurity concentration of e.g. $1 \times 10^{19}$-$1 \times 10^{20}$/cm$^{-3}$. On a first surface of the $n^+$-type drain layer 1, an n-type buffer layer 2 having a lower n-type impurity concentration than the first semiconductor layer is formed. A first pillar region 6 is formed on the surface of the n-type buffer layer 2. The first pillar region 6 is a super junction structure in which a plurality of p-type first pillar layers 4 and a plurality of n-type second pillar layers 5 are alternately repeated along the X direction (first direction) in FIG. 1 parallel to the first surface of the first semiconductor layer 1. The first pillar layers 4 and the second pillar layers 5 extend in the deposition direction, which is the direction (Z direction in FIG. 1) perpendicular to the first surface. Furthermore, the first pillar layers 4 and the second pillar layers 5 extend in the Y direction orthogonal to the X direction in the first surface to constitute a stripe structure.

A second pillar region 10 is formed adjacent to the first pillar region 6 along the X direction on the surface of the n-type buffer layer 2. The second pillar region 10 includes a p-type third pillar layer 7, an n-type fourth pillar layer 8, and a p-type fifth pillar layer 9. The third pillar layer 7 is adjacent to one of the plurality of second pillar layers 5 of the first pillar region 6 along the X direction in FIG. 1. The fourth pillar layer 8 is adjacent to the third pillar layer 7 along the X direction. The fifth pillar layer 9 is adjacent to the fourth pillar layer 8 along the X direction. Put differently, the third pillar layer 7 and the fourth pillar layer 8 constitute a pillar set, and the fifth pillar layer 9 is adjacent to this pillar set along the X direction. In this embodiment, the pillar set is composed of a pair of the third pillar layer 7 and the fourth pillar layer 8. However, in the example described later, the pillar set is composed of a plurality of pairs of the third pillar layer 7 and the fourth pillar layer 8. The third pillar layer 7, the fourth pillar layer 8, and the fifth pillar layer 9 extend in the Z direction like the first and second pillar layers (4, 5). Furthermore, the third pillar layer 7, the fourth pillar layer 8, and the fifth pillar layer 9 extend in the Y direction orthogonal to the X direction in the first surface to constitute a stripe structure.

In the first pillar region, the p-type first pillar layer and the n-type second pillar layer are formed so that the amount of impurity is equal in each pillar layer as a whole. In particular, in the p-type first pillar layer and the n-type second pillar layer, the amount of p-type impurity and the amount of n-type impurity per unit area in the cross section perpendicular to the X direction in the figure are made equal (balanced). Then, the p-type first pillar layer and the n-type second pillar layer are formed so that the amount of p-type impurity and the amount of n-type impurity are equal in the plane parallel to the first surface of the $n^+$-type drain layer 1 at each position (each depth) in the Z direction in the figure. Accordingly, as described later, when a reverse bias voltage is applied between the source layer and the drain layer, the first pillar region can be entirely depleted even if each pillar layer has high impurity concentration. The second pillar region is similarly formed so that the amount of impurity of the p-type third pillar layer is equal to that of the n-type fourth pillar layer. Here, the p-type first and third pillar layers can be formed as identical pillar layers, and the n-type second and fourth pillar layers can be formed as identical pillar layers. Then, the amount of impurity can be balanced also throughout the first and second pillar regions.

The p-type fifth pillar layer could be formed with the same amount of impurity as the third pillar layer. However, the fifth pillar layer is formed in the end portion of the second pillar region. Thus, the amount of impurity of the fifth pillar layer is preferably balanced with that of the half region along the X direction of the adjacent n-type fourth pillar layer. That is, in the plane parallel to the first surface of the $n^+$-type drain layer 1, the amount of p-type impurity of the fifth pillar layer 9 can be smaller than the amount of p-type impurity of the third pillar layer 7. Preferably, the amount of p-type impurity of the fifth pillar layer 9 is approximately half the amount of p-type impurity of the third pillar layer. Then, under application of reverse bias, the end portion of the second pillar region can also be completely depleted.

An $n^-$-type epitaxial layer 3 having an n-type impurity concentration of e.g. $1 \times 10^{15}$-$1 \times 10^{16}$/cm$^{-3}$ is formed adjacent to the p-type fifth pillar layer 9 of the second pillar region 10 along the X direction on the surface of the n-type buffer layer 2. The $n^-$-type epitaxial growth layer 3 has a lower n-type impurity concentration than the second and fourth pillar layers (5, 8).

An n-type channel stopper layer 29 is formed adjacent to the $n^-$-type epitaxial layer 3 on the opposite side from the second pillar region along the X direction. The n-type channel stopper layer 29 is exposed at the end portion along the outer periphery of the power semiconductor device 100 individually separated by dicing. The n-type impurity concentration of the n-type channel stopper layer 29 can be made equal to the n-type impurity concentration of the second and fourth pillar layers.

As an example, the above first to fifth pillar layers can be fabricated as follows, although not shown and described in detail. For instance, on the first surface of an $n^+$-type drain layer 1, an n-type buffer layer 2 having a lower n-type impurity concentration than the $n^+$-type drain layer 1 is formed. Then, the first layer of an $n^-$-type epitaxial layer 3 is epitaxially grown on the entire surface of the n-type buffer layer 2. Next, by using a mask on the surface of the first layer of the $n^-$-type epitaxial layer 3, p-type impurity is selectively ion implanted with a prescribed dose amount and a prescribed width into the region where p-type first, third, and fifth pillar layers (4, 7, 9) are to be formed. Next, by using another mask, n-type impurity is ion implanted with a prescribed dose amount and a prescribed width into the region where n-type second and fourth pillar layers (5, 8) are to be formed. Here, ion implantation can be performed simultaneously on the region where a channel stopper layer 29 is to be formed. Then, the channel stopper layer 29 can be formed simultaneously with the n-type second and fourth pillar layers (5, 8).

Next, the second layer of the $n^-$-type epitaxial layer 3 is epitaxially grown on the first layer like the first layer. Then, as in the foregoing, ion implantation of p-type impurity for forming p-type first, third, and fifth pillar layers, and ion implantation of n-type impurity for forming n-type second and fourth pillar layers and an n-type channel stopper layer 29 are performed. Subsequently, this process is repeated, particularly four times in this embodiment. Then, by heat treatment at high temperature, the n-type impurity and p-type impurity are diffused. Thus, as shown in FIG. 1, the power semiconductor device 100 includes first to fifth pillar layers (4, 5, 7, 8, 9), $n^-$-type epitaxial layer 3, and n-type channel stopper layer 29 adjacent along the X direction in the drift layer. With regard to the order of the ion implantation of p-type impurity and the ion implantation of n-type impurity, it does not matter which is performed first. In this embodiment, the process of epitaxial growth and ion implantation is repeated four times to form four stages of n-type impurity diffusion layers and p-type impurity diffusion layers. The impurity diffusion layers are linked in the direction (Z direction) perpendicular to the first surface to form p-type pillar layers and n-type pillar layers. By increasing the number of repetitions of this process of epitaxial growth and ion implantation, the thickness of each pillar layer can be increased. Thus, the breakdown voltage of the power semiconductor device 100 can be further increased.

When the first pillar region and the second pillar region are formed as described above, the amount of impurity can be balanced as follows. For instance, in the above process of ion implantation of n-type impurity and p-type impurity, the dose amounts are made equal, and the widths (pillar widths) of the regions subjected to ion implantation in the X direction in the figure are made equal. In each of the first region and the second region, the pillar widths and dose amounts for n-type impurity and p-type impurity may be made equal. Alternatively, throughout the first region and the second region, the pillar widths and dose amounts for n-type impurity and p-type impurity may be made equal. As described above, the p-type fifth pillar layer located at the end portion of the second pillar region is preferably formed so that the amount of impurity thereof is approximately half the amount of impurity of the adjacent n-type fourth pillar layer. Thus, the pillar width of the fifth pillar layer can be made approximately half the pillar width of the first and third pillar layer.

As another method for forming pillar layers, for instance, p-type semiconductor layers and n-type semiconductor layers can be buried by epitaxial growth in trenches formed in the $n^-$-type epitaxial layer 3 to form p-type pillar layers and n-type pillar layers.

A plurality of first p-type base layers 11 are formed and electrically connected, respectively, onto the plurality of p-type first pillar layers 4 in the first pillar region 6. A plurality of JFET layers 35 made of an n-type semiconductor layer are each formed between the adjacent first p-type base layers 11. The JFET layer 35 is electrically connected onto each of the plurality of n-type second pillar layers 5. A plurality of $n^+$-type source layers 14 are selectively formed, respectively, on the surface of the plurality of first p-type base layers 11. A plurality of first gate electrodes 17 are each formed astride the adjacent first p-type base layers 11 via a first gate insulating film 16. That is, each first gate electrode 17 is formed via the first gate insulating film 16 on the JFET layer 35, on opposed portions of the adjacent first p-type base layers 11 across this JFET layer 35, and on the $n^+$-type source layers 14. Each of the $n^+$-type source layers 14 is selectively formed in each of surfaces of the adjacent first p-type base layers 11. As described later, the first pillar region with this $n^+$-type source layers 14 formed therein constitutes a device region in which a current flows from the $n^+$-type drain layer 1 through the n-type second pillar layer 5 and the p-type base layer 11 to the $n^+$-type source layer 14. A termination region is formed around this device region on the end portion (dicing line portion) side of the power semiconductor device 100 as viewed from the device region.

Two adjacent second p-type base layers 12 are electrically connected, respectively, onto the p-type third pillar layer 7 and the p-type fifth pillar layer 9 in the second pillar region 10. The second p-type base layers 12 are formed so as to be spaced from each other. The second pillar region 10 with these second p-type base layers 12 formed therein constitutes the termination region where no current flows. Hence, no n-type source layer 14 is formed in the surface of the second p-type base layer 12. As on the first pillar region 6, a JFET layer 35 made of an n-type semiconductor layer is formed between the adjacent second p-type base layers 12. This JFET layer 35 is electrically connected onto the n-type fourth pillar layer 8. A second gate electrode 19 is formed via a second gate insulating film 18 on this JFET layer 35 sandwiched between the two adjacent second p-type base layers 12, and on opposed portions of these adjacent second p-type base layers 12. Among the plurality of first gate electrodes 17, the first gate electrode 17 nearest to the second pillar region 10 is formed astride, via the first gate insulating film 16, on the first p-type base layer 11 formed on the p-type first pillar layer 4 formed at the foremost end portion of the first pillar region 6, and on the second p-type base layer 12 formed on the p-type third pillar layer 7 of the second pillar region 10. Below this first gate electrode 17, like the other first gate electrodes 17, the n-type second pillar layer 5 and the JFET layer 35 are located.

A third p-type base layer 13 is formed via a JFET layer 35 on the second pillar region 10 side on the surface of the $n^-$-type epitaxial layer 3. The third p-type base layer 13 is formed adjacent to the second p-type base layer 12 which is formed and electrically connected onto the fifth pillar layer 9. The third p-type base layer 13 may have the same width as the first p-type base layer 11 or the second p-type base layer 12 in the X direction. However, the third p-type base layer 13 preferably has a wider width than the first p-type base layer 11 or the second p-type base layer 12. This is because, as described later, the hole current generated by avalanche breakdown needs to be efficiently ejected in the termination region through the third p-type base layer 13 to the source electrode. A third gate electrode 21 is formed astride, via a third gate insulating film 20, on this second p-type base layer 12 formed on the fifth pillar layer 9, and on the third p-type base layer 13. Like the second p-type base layer 12, the third p-type base layer 13 is formed in the termination region where no current flows. Hence, also in the surface thereof, no $n^+$-type source layer 14 is formed.

Two p-type guard ring layers 25 spaced from each other are formed on the surface of the $n^-$-type epitaxial layer 3 and spaced from the third p-type base layer 13. An n-type semiconductor layer 30 is formed and electrically connected onto the channel stopper layer 29. An insulating film 27 is formed so as to cover the end portion on the dicing line side of the third p-type base layer, the p-type guard ring layers 25, and the end portion on the device region side of the n-type semiconductor layer 30. In an opening of the insulating film 27, a field plate electrode 28 is brought into ohmic contact with the p-type guard ring layer 25 via a p$^+$-type contact layer 26. In another opening of the insulating film 27, a channel stopper electrode 33 is formed on the n-type semiconductor layer 30 via a p$^+$-type semiconductor layer 31 and an n$^+$-type semiconductor layer 32. The channel stopper electrode 33 is brought into ohmic contact with the n-type semiconductor layer 30 via the n$^+$-type semiconductor layer 32, and electrically connected to the channel stopper layer 29.

Here, the first to third p-type base layers (11, 12, 13), the JFET layers 35, the p-type guard ring layers 25, the n-type semiconductor layer 30, the p$^+$-type contact layers (15, 26, 31), and the n$^+$-type source layers 14 can be formed as follows, for instance. The process including forming an n$^-$-type epitaxial layer 3 and ion implantations of n-type and p-type impurities is repeated a plurality of times to form the first and second pillar regions (6, 10) and the channel stopper layer described above. Then, finally, an n$^-$-type epitaxial layer 3 is formed on the entire surface. Next, the above insulating film 27, first to third gate electrodes and the like are used as a mask to perform ion implantation of n-type impurity and p-type impurity into the last epitaxially grown n$^-$-type epitaxial layer 3. Next, by heat treatment, the above layers are formed.

A source electrode 23 is formed via an interlayer insulating film 22 on the first gate electrodes 17, the second gate electrode 19, and the third gate electrode 21. Thus, the source electrode 23 is insulated from the first to third gate electrodes 17, 19, 21. The source electrode 23 is brought into ohmic contact with the first p-type base layer 11, the second p-type base layer 12, and the third p-type base layer 13 via the p$^+$-type contact layers 15 formed between the n$^+$-type source layers 14 on the surface of the first p-type base layer 11, on the second p-type base layer 12, and on the third p-type base layer 13, respectively. A drain electrode 24 is formed in ohmic contact with a second surface of the n$^+$-type drain layer 1 opposite to the first surface. Here, the first to third gate electrodes 17, 19, 21 are electrically connected to each other in a region not shown, and extracted to the outside of the power semiconductor device 100 through the opening of the interlayer insulating film 22. Likewise, the source electrode 23 and the drain electrode 24 are also extracted to the outside of the power semiconductor device 100 in a region not shown.

Next, the operation of the power semiconductor device 100 according to this embodiment is described. The drain electrode 24 is applied with a positive voltage with respect to the source electrode 23. In this state, the first gate electrode 17 is applied with a voltage exceeding the threshold. Then, a channel layer resulting from population inversion is formed in the portion of the surface of the first p-type base layer 11 opposed to the first gate electrode 17 so as to connect the n$^+$-type source layer 14 and the n-type second pillar layer 5. Thus, the power semiconductor device 100 is turned on. As a result, in the first pillar region 6, a current flows from the drain electrode 24 through the n$^+$-type drain layer 1, the n-type second pillar layer 5, the first p-type base layer 11, and the n$^+$-type source layer 14 to the source electrode 23. This current is controlled by the voltage applied to the first gate electrode 17. By the second and third gate electrodes, channel layers are formed in the second and third p-type base layers, respectively. However, because no n$^+$-type source layer 14 is formed therein, no current flows in the second pillar region 10 and the n$^-$-type epitaxial layer 3.

If the voltage applied to the first gate electrode 17 is lower than the threshold, the channel layer disappears. Hence, the power semiconductor device 100 is turned off, and the current flowing from the drain electrode 24 to the source electrode 23 is blocked. Then, the voltage applied between the source electrode 23 and the drain electrode 24 depletes the first pillar region 6, the second pillar region 10, and the n$^-$-type epitaxial layer 3. To decrease the on-resistance, the n-type impurity concentration of the second and fourth pillar layers 5, 8 is set high. However, the amount of n-type impurity is made equal to the amount of p-type impurity of the first and third pillar layers 4, 7. Hence, the first pillar region 6 and the second pillar region 10 are completely depleted, and high breakdown voltage is maintained therein. On the other hand, the n$^-$-type epitaxial layer 3 has low impurity concentration because there is no need to reduce the on-resistance. Hence, the n$^-$-type epitaxial layer 3 is likely to be depleted and has high breakdown voltage. By decreasing the impurity concentration of the n$^-$-type epitaxial layer 3, the breakdown voltage of the n$^-$-type epitaxial layer 3 can be made higher than that of the first and second pillar regions.

In the connecting portion of the second pillar region 10 and the n$^-$-type epitaxial layer 3, the repeated structure of p-type pillar layers and n-type pillar layers continuing in the first and second pillar regions is stopped. In this portion, it is difficult to keep the balance between the amount of p-type impurity and the amount of n-type impurity. In this embodiment, the amount of p-type impurity of the fifth pillar layer 9 is made approximately half the amount of n-type impurity of the adjacent fourth pillar layer 8 (i.e., approximately half the amount of p-type impurity of the p-type third pillar layer 7). Thus, the amount of impurity is balanced at the junction of the fourth pillar layer 8 and the fifth pillar layer 9. However, in this connecting portion, it is more difficult to balance the amount of impurity than at the p-n junction in the first and second pillar regions 4, 5. Thus, when the power semiconductor device 100 is turned off, the breakdown voltage is low, and avalanche breakdown is likely to occur. In order to prevent device destruction by current concentration of holes generated by avalanche breakdown, holes generated by avalanche breakdown need to be efficiently (with low electrical resistance) ejected to the source electrode. In the power semiconductor device 100 according to this embodiment, holes generated by avalanche breakdown in the fifth pillar layer 9 are ejected to the source electrode 23 not only through the third p-type base layer 13, but also through the second p-type base layer 12 connected onto the fifth pillar layer 9 and the second p-type base layer 12 connected onto the third pillar layer 7. In the second p-type base layer 12, no n$^+$-type source layer 14 is formed, and hence the contact area with the source electrode 23 is larger than in the first p-type base layer 11. Thus, in the second p-type base layer 12, the resistance for hole ejection is lower. Hence, heat generation due to ejection of the hole current generated by avalanche breakdown can be kept low. Furthermore, in the second p-type base layer 12 and the third p-type base layer 13, no n$^+$-type source layer 14 is formed. Hence, there is also no concern that the hole current of avalanche breakdown causes latch-up of the parasitic transistor made of the n$^+$-type source layer, second p-type base layer (third p-type base layer), and fourth n-type pillar layer (n$^-$-type epitaxial layer 3). Thus, the power semiconductor device 100 according to this embodiment has high avalanche withstand capability in the termination region, and can be operated with high breakdown voltage.

Figure 3:
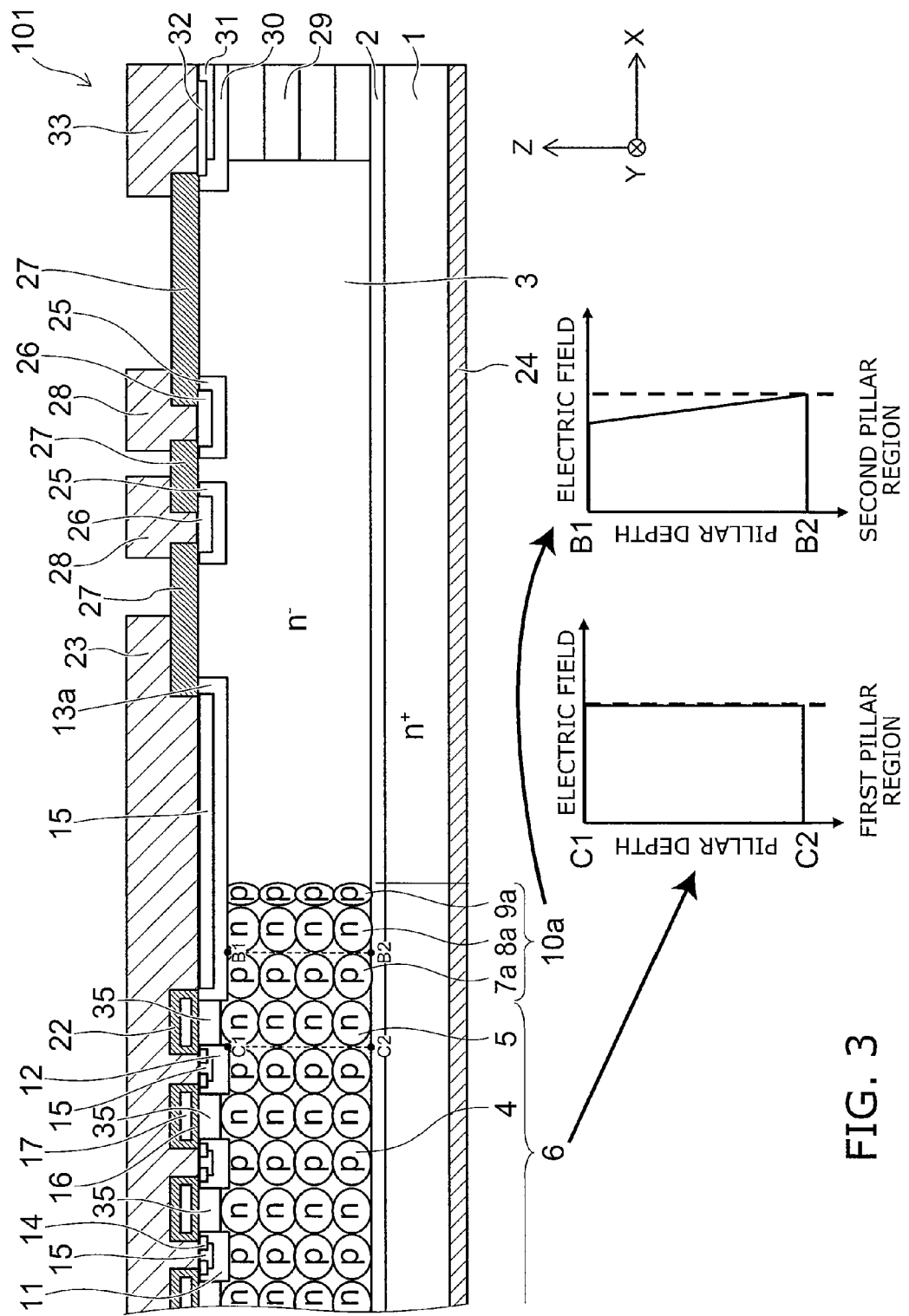
FIG. 3 is a schematic sectional view of a main part of a power semiconductor device according to a comparative example.

Next, the advantage of this embodiment is described by comparing the power semiconductor device 100 according to this embodiment with a power semiconductor device 101 of a comparative example. FIG. 3 is a schematic sectional view of the main part of the power semiconductor device 101 of the comparative example. The portions having the same configuration as those described in this embodiment are labeled with like reference numerals or symbols, and the description thereof is omitted. Differences from this embodiment are primarily described.

The power semiconductor device 101 of the comparative example has a structure different from that of the power semiconductor device 100 according to this embodiment in the following points. The second gate electrode 19 and the second gate insulating film 18 are eliminated. The third gate electrode 21 and the third gate insulating film 20 are eliminated. The adjacent two second p-type base layers 12 and third p-type base layer 13 are connected in the horizontal direction (X direction) to form one third p-type base layer 13a. The source electrode 23 is brought into ohmic contact with the third p-type base layer 13a via the p$^+$-type contact layer 15. Except the above points, the power semiconductor device 101 of the comparative example is the same as the power semiconductor device 100 according to this embodiment.

In contrast to the power semiconductor device 100 according to this embodiment, the power semiconductor device 101 of the comparative example does not have the structure in which in the upper portion of the second pillar region 10a, a plurality of second p-type base layers 12 are spaced from each other and sandwiches a JFET layer 35. Hence, the contact area between the third p-type base layer 13a and the source electrode 23 is large. Thus, in the power semiconductor device 101 of the comparative example, if avalanche breakdown occurs in the fifth pillar layer 9a, the resistance for holes to be released to the source electrode is lower than in the power semiconductor device 100 of this embodiment. However, in the power semiconductor device 101, in the upper portion of the second pillar region 10a, the third p-type base layer 13a exists above the n-type fourth pillar layer 8a. Hence, in the second pillar region 10a, as compared with the first pillar region 6, the amount of p-type impurity is larger than the amount of n-type impurity near the surface on the source electrode 23 side. In the second pillar region 10a, the amount of impurity is unbalanced. Thus, the second pillar region 10a as a whole is approximately regarded as a p-type semiconductor layer having a small amount of p-type impurity. In contrast, in the first pillar region 6, an n-type JFET layer 35 is connected onto the n-type second pillar layer 5. On the source electrode 23 side, the amount of p-type impurity and the amount of n-type impurity are balanced. Thus, the first pillar region 6 as a whole is approximately regarded as a completely depleted high resistance layer. In the lower portion of FIG. 3, electric field intensity distributions in the depth direction along C1-C2 and B1-B2 cross sections in the first pillar region 6 and the second pillar region 10a are shown. The left side shows the electric field intensity distribution of the first pillar region 6, and the right side shows the electric field intensity distribution of the second pillar region 10a. Because the first pillar region 6 is completely depleted, the electric field intensity is constant in the depth direction. In contrast, the second pillar region 10a as a whole is approximated as a p-type semiconductor. Thus, the electric field intensity has a distribution of gradually decreasing toward the source electrode 23. The breakdown voltage is given by the integrated value of electric field intensity in the depth direction. Hence, the breakdown voltage of the second pillar region 10a is significantly lower than that of the first pillar region 6. Thus, the power semiconductor device 101 of the comparative example has low breakdown voltage in the termination region. Hence, device destruction is likely to occur in the termination region.

In contrast, in the power semiconductor device 100 according to this embodiment, in the second pillar region 10, as in the first pillar region 6, an n-type JFET layer 35 is provided on the n-type pillar layer. Second p-type base layers 12 are formed adjacent to each other across this JFET layer 35. On the source electrode 23 side, the second pillar region 10 has the same pillar structure as the first pillar region 6. Hence, the second pillar region 10 of the power semiconductor device 100 according to this embodiment has a breakdown voltage nearly equal to that of the first pillar region 6. Thus, as compared with the power semiconductor device 101 of the comparative example, the breakdown voltage in the termination region is improved, and device destruction in the termination region is suppressed. The breakdown voltage of the power semiconductor device 101 of the comparative example was 640 V. In contrast, the breakdown voltage of the power semiconductor device 100 according to this embodiment was improved to 670 V.

The power semiconductor device 100 according to this embodiment includes a first pillar region 6 forming the device region, and a second pillar region 10 adjacent to this first pillar region 6 along the X direction. The second pillar region 10 includes a pillar set, and a fifth pillar layer 9 adjacent to this pillar set along the X direction. The pillar set includes a third pillar layer 7, and a fourth pillar layer 8 adjacent to this third pillar layer 7 along the X direction. A plurality of p-type second base layers 12 are electrically connected, respectively, onto the third pillar layer 7 and the fifth pillar layer 9, and spaced from each other. In this p-type second base layer 12, no n$^+$-type source layer 14 is formed. Thus, holes generated by avalanche breakdown are ejected with low resistance to the source electrode 23 above the second pillar region 10. Furthermore, the occurrence of latch-up can be suppressed. Hence, in the power semiconductor device 100, device destruction in the termination region can be suppressed. Furthermore, also on the source electrode 23 side of the second pillar region 10, the amount of p-type impurity and the amount of n-type impurity can be balanced. Hence, in the power semiconductor device 100, the breakdown voltage in the termination region is as high as in the device region. That is, this embodiment provides a power semiconductor device in which device destruction in the termination region is suppressed.

Second Embodiment

Figure 4:
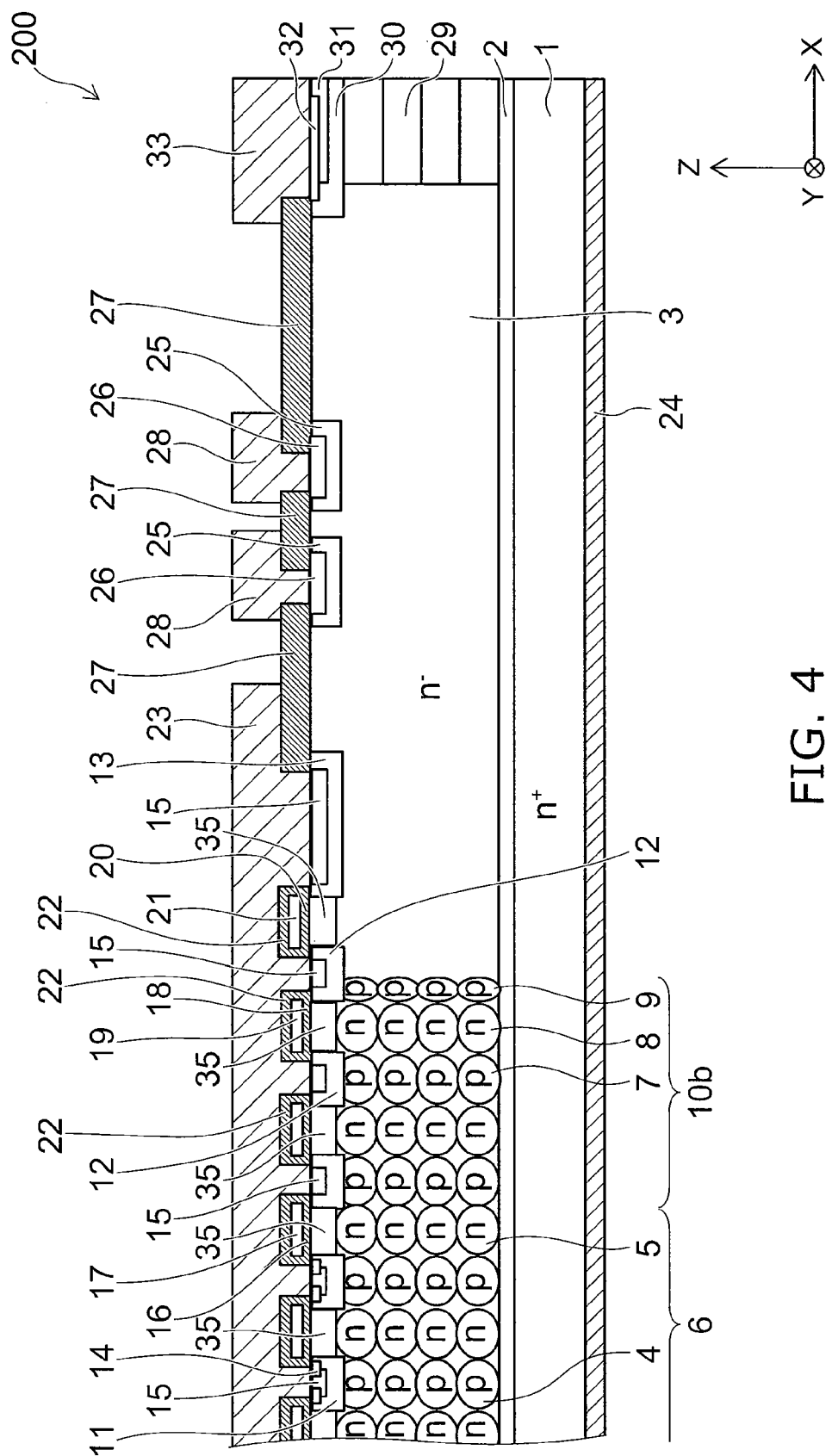
FIG. 4 is a schematic sectional view of a main part of a power semiconductor device according to a second embodiment.

A power semiconductor device 200 according to a second embodiment is described with reference to FIG. 4. FIG. 4 is a schematic sectional view of the main part of the power semiconductor device 200 according to the second embodiment. The portions having the same configuration as those described in the first embodiment are labeled with like reference numerals or symbols, and the description thereof is omitted. Differences from the first embodiment are primarily described.

As shown in FIG. 4, the power semiconductor device 200 according to this embodiment is different from the power semiconductor device 100 according to the first embodiment in the following points. The power semiconductor device 200 has a structure in which, between the n-type second pillar layer 5 of the first pillar region 6 and the p-type third pillar layer 7 of the second pillar region 10 in the power semiconductor device 100 according to the first embodiment, another pair of the p-type third pillar layer 7 and the n-type fourth pillar layer 8 is inserted. That is, in the power semiconductor device 100 according to the first embodiment, the pillar set of the second pillar region includes one pair of the third pillar layer 7 and the fourth pillar layer 8. In contrast, in the power semiconductor device 200 according to this embodiment, the pillar set is composed of two periods (two pairs) of the third pillar layer 7 and the fourth pillar layer 8 alternately and repeatedly arranged along the X direction in the figure. A second p-type base layer 12 is additionally formed so as to be connected onto the added third pillar layer 7. An n-type JFET layer 35 is additionally formed so as to be connected onto the added fourth pillar layer 8. Furthermore, a second gate electrode 19 is additionally formed via a second gate insulating film 18 onto the added second p-type base layer 12 and the adjacent second p-type base layer 12.

As described above, as compared with the power semiconductor device 100 according to the first embodiment, the power semiconductor device 200 according to this embodiment includes one more pair of the second p-type base layer 12 and the second gate electrode 19 in the second pillar region 10b where no current flows. Thus, when avalanche breakdown occurs in the fifth pillar layer 9 located at the end portion of the second pillar region 10b, the resistance for holes to be ejected to the source electrode 23 is further reduced. Hence, the power semiconductor device 200 according to this embodiment has higher avalanche withstand capability in the termination region and higher reliability than the power semiconductor device 100 according to the first embodiment. As the number of second p-type base layers 12 is increased in this second pillar region 10b, the avalanche withstand capability can be made higher. However, this increases the proportion of the area of the termination region relative to the device region and contributes to the increase of manufacturing cost. Hence, in practice, the number of second p-type base layers 12 is specifically determined by design. Besides the foregoing, the second embodiment achieves an effect similar to that of the first embodiment. That is, this embodiment provides a power semiconductor device in which device destruction in the termination region is suppressed.

Third Embodiment

Figure 5:
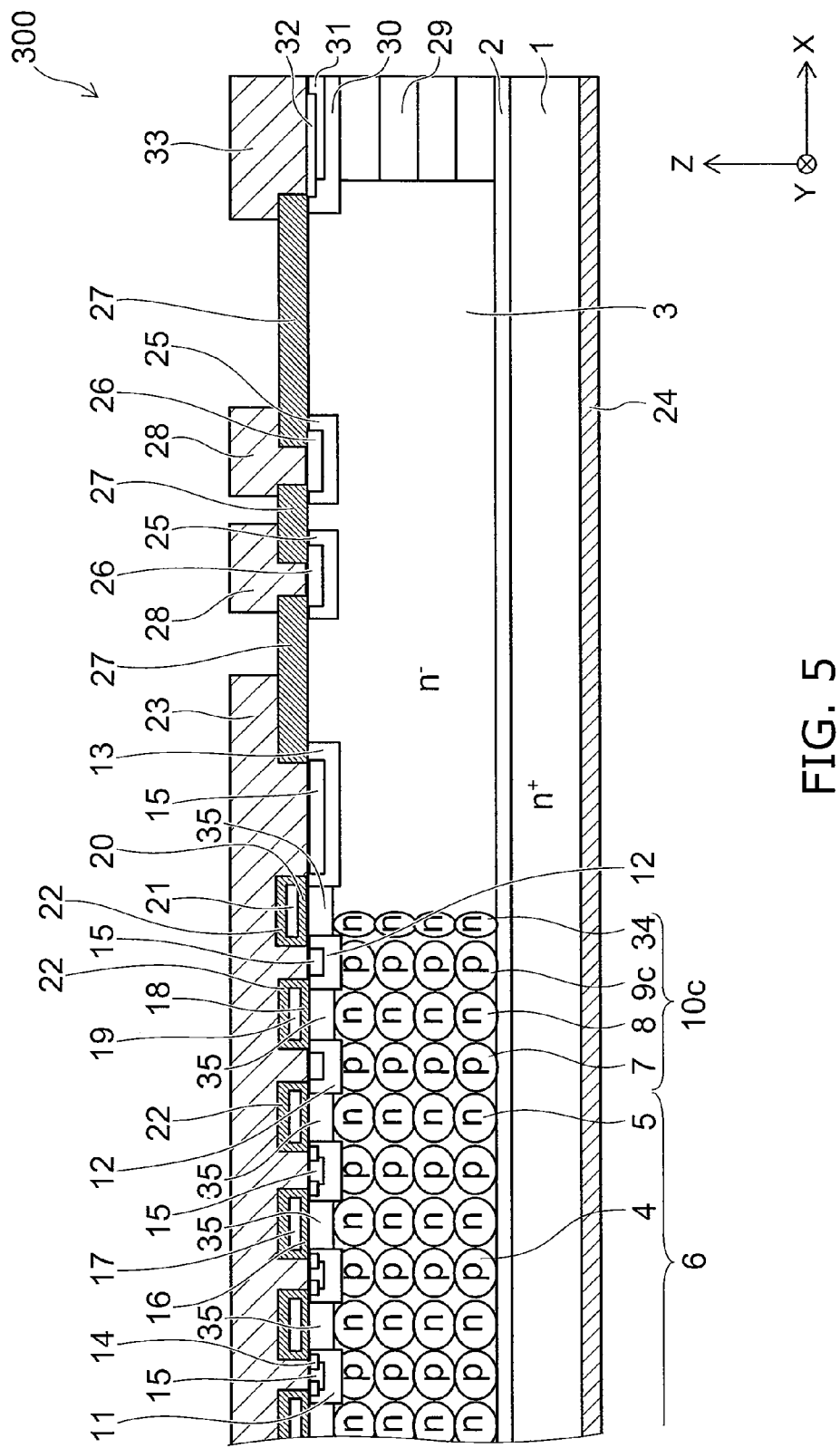
FIG. 5 is a schematic sectional view of a main part of a power semiconductor device according to a third embodiment.

A power semiconductor device 300 according to a third embodiment is described with reference to FIG. 5. FIG. 5 is a schematic sectional view of the main part of the power semiconductor device 300 according to the third embodiment. The portions having the same configuration as those described in the first embodiment are labeled with like reference numerals or symbols, and the description thereof is omitted. Differences from the first embodiment are primarily described.

The power semiconductor device 300 according to the third embodiment is different from the semiconductor device 100 according to the first embodiment in that in the second pillar region 10c, an n-type sixth pillar layer 34 is further provided between the p-type fifth pillar layer 9c and the $n^-$-type epitaxial layer 3. This n-type sixth pillar layer 34 is connected onto an n-type JFET layer 35. The n-type JFET layer 35 is sandwiched between the second p-type base layer 12 connected onto the fifth pillar layer 9c and the third p-type base layer 13. A third gate electrode 21 is placed above the sixth pillar layer 34. In this case, the p-type fifth pillar layer 9c is not formed at the end portion of the second pillar region 10c. Hence, the p-type fifth pillar layer 9c is formed in the same structure as the p-type third pillar layer 7. That is, the p-type fifth pillar layer 9c is formed so that the amount of p-type impurity thereof is equal to the amount of p-type impurity of the p-type third pillar layer 7 in the plane parallel to the first surface of the $n^+$-type drain layer 1. Instead, the n-type sixth pillar layer 34 is formed at the end portion of the second pillar region 10c. Hence, the n-type sixth pillar layer 34 can be formed so that the amount of n-type impurity thereof is smaller than the amount of n-type impurity of the n-type fourth pillar layer 8 in the plane parallel to the first surface of the $n^+$-type drain layer 1. Preferably, the n-type sixth pillar layer 34 can be formed so that the amount of n-type impurity thereof is approximately half the amount of n-type impurity of the n-type fourth pillar layer 8.

In the power semiconductor device 300 of this embodiment, the end portion of the second pillar region 10c is made of the n-type sixth pillar layer 34. Hence, avalanche breakdown is likely to occur in the region of the sixth pillar layer 34. As compared with the power semiconductor device 100 according to the first embodiment, holes resulting from avalanche breakdown are more likely to flow into the third p-type base layer 13. This slightly increases the avalanche withstand capability. Besides the foregoing, the power semiconductor device 300 achieves an effect similar to that of the first embodiment. That is, this embodiment provides a power semiconductor device in which device destruction in the termination region is suppressed.

Fourth Embodiment

Figure 6:
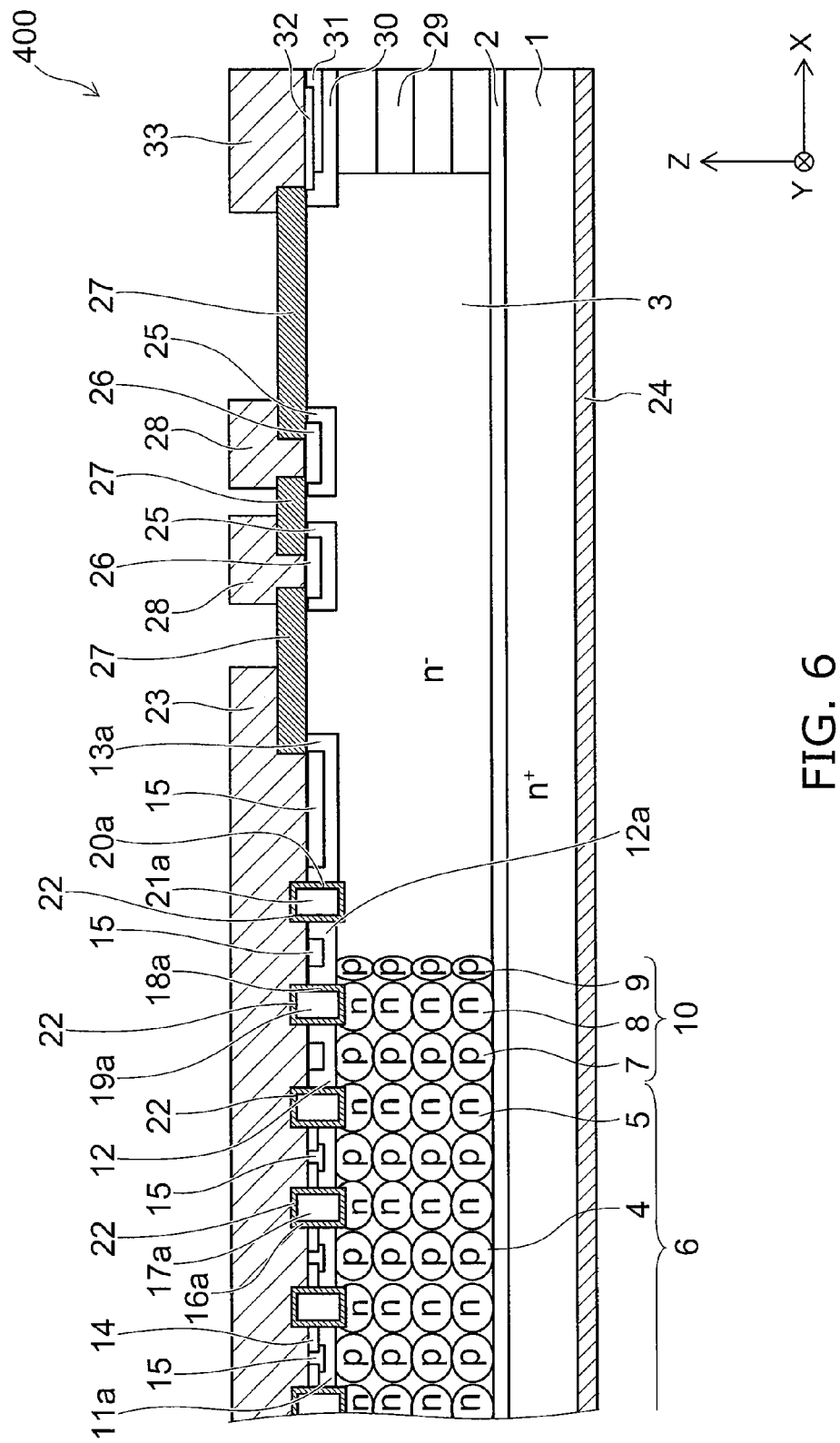
FIG. 6 is a schematic sectional view of a main part of a power semiconductor device according to a fourth embodiment.

A power semiconductor device 400 according to a fourth embodiment is described with reference to FIG. 6. FIG. 6 is a schematic sectional view of the main part of the power semiconductor device 400 according to the fourth embodiment. The portions having the same configuration as those described in the first embodiment are labeled with like reference numerals or symbols, and the description thereof is omitted. Differences from the first embodiment are primarily described.

The power semiconductor device 400 according to the fourth embodiment is different from the power semiconductor device 100 according to the first embodiment in the following point. The power semiconductor device 400 includes gate electrodes of the trench structure, whereas the power semiconductor device 100 includes gate electrodes of the planar structure. The rest of the structure is the same as that of the first embodiment. In the power semiconductor device 400 according to the fourth embodiment, a first gate electrode 17a is formed between adjacent first p-type base layers 11a. The first gate electrode 17a is buried via a first gate insulating film 16a in a first trench. In the first trench, a first of the adjacent first p-type base layers 11a is exposed at a first sidewall of the first trench. A second of the adjacent first p-type base layers 11a is exposed at a second sidewall of the first trench. The n-type second pillar layer 5 is exposed at a bottom surface of the first trench. A second gate electrode 19a is formed between the adjacent second p-type base layers 12a. The second gate electrode 19a is buried via a second gate insulating film 18a in a second trench. In the second trench, a first of the adjacent second p-type base layers 12a is exposed at a first sidewall of the second trench. A second of the adjacent second p-type base layers 12a is exposed at a second sidewall of the second trench. The n-type fourth pillar layer 8 is exposed at a bottom surface of the second trench. A third gate electrode 21a is formed between the second p-type base layer 12a connected onto the p-type fifth pillar layer 9 and the third p-type base layer 13a adjacent thereto. The third gate electrode 21a is buried via a third gate insulating film 20a in a third trench. In the third trench, the above second p-type base layer 12a is exposed at a first sidewall of the third trench. The above third p-type base layer 13 is exposed at a second sidewall of the third trench. The n⁻-type epitaxial layer 3 is exposed at a bottom surface of the third trench. An interlayer insulating film 22 is formed on the buried first to third gate electrodes 17a, 19a, 21a. Thus, the first to third gate electrodes 17a, 19a, 21a are insulated from the source electrode 23 by the interlayer insulating film 22.

Like the power semiconductor device 100 according to the first embodiment, the power semiconductor device 400 according to this embodiment also includes a first pillar region 6 forming the device region, and a second pillar region 10 adjacent to this first pillar region 6 along the X direction. The second pillar region 10 includes a pillar set, and a fifth pillar layer 9 adjacent to this pillar set along the X direction. The pillar set includes a third pillar layer 7, and a fourth pillar layer 8 adjacent to this third pillar layer 7 along the X direction. A plurality of p-type second base layers 12 are electrically connected, respectively, onto the third pillar layer 7 and the fifth pillar layer 9, and spaced from each other. In this p-type second base layer 12, no n⁺-type source layer 14 is formed. Thus, holes generated by avalanche breakdown are ejected with low resistance to the source electrode 23 above the second pillar region 10. Furthermore, the occurrence of latch-up can be suppressed. Hence, in the power semiconductor device 400, device destruction in the termination region can be suppressed. Furthermore, also on the source electrode 23 side of the second pillar region 10, the amount of p-type impurity and the amount of n-type impurity can be balanced. Hence, in the power semiconductor device 400, the breakdown voltage in the termination region is high. That is, this embodiment provides a power semiconductor device in which device destruction in the termination region is suppressed. Furthermore, in the power semiconductor device 400 according to this embodiment, the gate electrode is formed as a gate electrode of the trench structure. Thus, advantageously, the packing density can be made higher than that for the gate electrode of the planar structure.

In the embodiments and comparative example described above, the power semiconductor device has been described in the case where the first to fifth pillar layers are pillar layers in a striped configuration extending in the Y direction in the figure. However, the first to fifth pillar layers can also be pillar layers in a lattice or staggered configuration extending in the Y direction as long as the power semiconductor device has a structure shown in the main part sectional views according to the examples.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device comprising:
    a first semiconductor layer of a first conductivity type having a first surface;
    a first pillar region provided on the first surface of the first semiconductor layer and composed of a plurality of first pillar layers of a second conductivity type and a plurality of second pillar layers of the first conductivity type alternately and repeatedly arranged along a first direction parallel to the first surface;
    a second pillar region provided on the first surface of the first semiconductor layer, being adjacent to at least one second pillar layer of the plurality of second pillar layers of the first pillar region along the first direction, and composed of:
        a pillar set composed of at least one third pillar layer of the second conductivity type and one fourth pillar layer of the first conductivity type adjacent to the third pillar layer along the first direction; and
        a fifth pillar layer of the second conductivity type adjacent to the pillar set along the first direction;
    an epitaxial layer of the first conductivity type provided on the first surface of the first semiconductor layer, being adjacent to the second pillar region along the first direction, and having a lower first conductivity type impurity concentration than the second pillar layer;
    a plurality of first base layers of the second conductivity type electrically connected, respectively, onto the plurality of first pillar layers and spaced from each other;
    a plurality of second base layers of the second conductivity type electrically connected, respectively, onto the third pillar layer and the fifth pillar layer and spaced from each other;
    a third base layer of the second conductivity type provided on a surface of the epitaxial layer so as to be adjacently spaced from a second base layer of the plurality of second base layers, the second base layer connected onto the fifth pillar layer;
    a plurality of source layers of the first conductivity type selectively formed in respective surfaces of the plurality of first base layers and having a higher first conductivity type impurity concentration than the epitaxial layer;
    a first gate electrode provided via a first gate insulating film on adjacent ones of the plurality of first base layers, on the source layers formed on the adjacent first base layers, and on the second pillar layer;
    a second gate electrode provided via a second gate insulating film on adjacent ones of the plurality of second base layers and on the fourth pillar layer;
    a third gate electrode provided via a third gate insulating film on the third base layer and the second base layer connected onto the fifth pillar layer;
    a first electrode provided on and electrically connected to a surface of the first semiconductor layer opposite to the first surface; and
    a second electrode electrically connected to the source layers, the first base layers, the second base layers, and the third base layer.

2. The device according to claim 1, wherein the pillar set is composed of a single third pillar layer and a single fourth pillar layer arranged along the first direction.

3. The device according to claim 1, wherein the pillar set is composed of a plurality of third pillar layers and a plurality of fourth pillar layers alternately and repeatedly arranged along the first direction, and the plurality of second base layers are spaced from each other and electrically connected, respectively, onto the plurality of third pillar layers.

4. The device according to claim 1, further comprising:
    a plurality of third semiconductor layers of the first conductivity type, each electrically connected to one second pillar layer of the plurality of second pillar layers between adjacent ones of the first base layers or electrically connected to the fourth pillar layer between adjacent ones of the second base layers.

5. The device according to claim 1, wherein in a plane parallel to the first surface, an amount of second conductivity type impurity of the fifth pillar layer is smaller than an amount of second conductivity type impurity of the third pillar layer.

6. The device according to claim 1, wherein the second pillar region further includes a sixth pillar layer of the first conductivity type between the fifth pillar layer and the epitaxial layer.

7. The device according to claim 6, wherein in a plane parallel to the first surface, an amount of first conductivity type impurity of the sixth pillar layer is made smaller than an amount of first conductivity type impurity of the fourth pillar layer.

8. The device according to claim 1, wherein the third base layer has a wider width than the second base layers along the first direction.

9. The device according to claim 1, further comprising:
a fourth semiconductor layer of the first conductivity type between the first semiconductor layer on one hand and the first pillar region and the second pillar region on the other.

10. The device according to claim 1, further comprising:
a fifth semiconductor layer of the second conductivity type between the first semiconductor layer and the first electrode.

11. The device according to claim 1, wherein
the first gate electrode is buried via the first gate insulating film in a first trench, a first of adjacent ones of the first base layers is exposed at a first sidewall of the first trench, a second of the adjacent ones of the first base layers is exposed at a second sidewall of the first trench, and the second pillar layer is exposed at a bottom surface of the first trench;
the second gate electrode is buried via the second gate insulating film in a second trench, a first of adjacent ones of the second base layers is exposed at a first sidewall of the second trench, a second of the adjacent ones of the second base layers is exposed at a second sidewall of the second trench, and the fourth pillar layer is exposed at a bottom surface of the second trench; and
the third gate electrode is buried via the third gate insulating film in a third trench, the second base layer connected onto the fifth pillar layer is exposed at a first sidewall of the third trench, the third base layer is exposed at a second sidewall of the third trench, and the epitaxial layer is exposed at a bottom surface of the third trench.

12. The device according to claim 11, wherein the pillar set is composed of a single third pillar layer and a single fourth pillar layer arranged along the first direction.

13. The device according to claim 11, wherein the pillar set is composed of a plurality of third pillar layers and a plurality of fourth pillar layers alternately and repeatedly arranged along the first direction, and the plurality of second base layers are spaced from each other and electrically connected, respectively, onto the plurality of third pillar layers.

14. The device according to claim 11, wherein in a plane parallel to the first surface, amount of second conductivity type impurity of the fifth pillar layer is made smaller than amount of second conductivity type impurity of the third pillar layer.

15. The device according to claim 11, wherein the second pillar region further includes a sixth pillar layer of the first conductivity type between the fifth pillar layer and the epitaxial layer.

16. The device according to claim 15, wherein in a plane parallel to the first surface, amount of first conductivity type impurity of the sixth pillar layer is made smaller than amount of first conductivity type impurity of the fourth pillar layer.

17. The device according to claim 11, wherein the third base layer has a wider width than the second base layers along the first direction.

18. The device according to claim 11, further comprising:
a fourth semiconductor layer of the first conductivity type between the first semiconductor layer on one hand and the first pillar region and the second pillar region on the other.

19. The device according to claim 11, further comprising:
a fifth semiconductor layer of the second conductivity type between the first semiconductor layer and the first electrode.

* * * * *